United States Patent
Dobuzinsky et al.

(10) Patent No.: US 7,087,532 B2
(45) Date of Patent: Aug. 8, 2006

(54) FORMATION OF CONTROLLED SUBLITHOGRAPHIC STRUCTURES

(75) Inventors: David M Dobuzinsky, New Windsor, NY (US); Jochen C. Beintner, Wappingers Falls, NY (US); Siddhartha Panda, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 10/711,683

(22) Filed: Sep. 30, 2004

(65) Prior Publication Data

US 2006/0068596 A1   Mar. 30, 2006

(51) Int. Cl.
*H01L 21/302* (2006.01)
*H01L 21/461* (2006.01)

(52) U.S. Cl. .............. 438/717; 438/725; 438/737; 438/740; 430/311; 257/E21.206

(58) Field of Classification Search .............. 438/717, 438/725, 737, 740; 430/311; 257/E21.206
See application file for complete search history.

(56) References Cited

U.S. PATENT DOCUMENTS

| | | | |
|---|---|---|---|
| 5,714,039 A | 2/1998 | Beilstein, Jr. et al. | 438/694 |
| 5,834,818 A | 11/1998 | Beilstein, Jr. et al. | 257/390 |
| 5,920,101 A | 7/1999 | Beilstein, Jr. et al. | 257/390 |
| 6,040,214 A | 3/2000 | Boyd et al. | 438/244 |
| 6,194,268 B1 | 2/2001 | Furukawa et al. | 438/257 |
| 6,498,061 B1 | 12/2002 | Divakaruni et al. | 438/243 |
| 6,610,607 B1 | 8/2003 | Armbrust et al. | 438/717 |
| 2004/0002203 A1 | 1/2004 | Deshpande et al. | 438/525 |
| 2005/0164478 A1* | 7/2005 | Chan et al. | 438/585 |
| 2005/0255651 A1* | 11/2005 | Qian et al. | 438/257 |
| 2006/0060562 A1* | 3/2006 | Furukawa et al. | 216/41 |

* cited by examiner

*Primary Examiner*—Fernando L. Toledo
(74) *Attorney, Agent, or Firm*—Eric W. Petraske

(57) ABSTRACT

A process for forming sublithographic structures such as fins employs a hardmask protective layer above a hardmask to absorb damage during a dry etching step, thereby preserving symmetry in the hardmask and eliminating a source of defects.

20 Claims, 10 Drawing Sheets

FORMATION OF CONTROLLED SUBLITHOGRAPHIC STRUCTURES

BACKGROUND OF THE INVENTION

The field of the invention is that of integrated circuit fabrication, in particular forming sublithographic structures.

In the field of integrated circuit processing, there is relentless pressure to shrink the dimensions of individual features such as lines or holes.

At any given time, the state of lithography has a minimum achievable dimension that is sufficiently reliable to be used commercially.

Workers in the art have constructed "sublithographic" features by fabricating a dummy pillar or block with vertical sides, depositing a sidewall of material on the vertical sides with a thickness less than the minimum ground rule that is available, then removing the pillar selective to the sidewall, thereby leaving the sidewall as a thin vertical member (often called a fin) having a width less than is possible to achieve using the standard lithographic groundrules.

The sidewall is selected for its ability to form a thin fin that is strong enough to survive the processing, not for its electrical properties. Accordingly, the fin is often used as a hardmask to pattern a lower layer that is not as durable, but has better electrical properties.

A conventional process of forming thin vertical fins in the prior art includes the following;

(1) Form a stack of the structure material that will form the fins (silicon), hardmask (oxide) and temporary or dummy layer (silicon);
(2) Etch temporary pillars in the dummy layer that will support the sidewalls;
(3) Deposit a conformal (nitride) spacer film over the dummy pillars having a thickness that will define the width of the final structures;
(4) Directionally etch the horizontal portions of the conformal spacer film, exposing the top of the dummy material and the hardmask;
(5) Planarize the common top surface of the dummy material and the sidewalls;
(6) Remove the dummy pillars, leaving the sidewalls;
(7) HF clean the oxide hardmask after silicon removal;
(8) Etch the hardmask, using the sidewalls as a mask;
(9) Directionally etch the structure layer, using the hardmask to define the final structure, thereby forming the fins.

The sequence according to the prior art is illustrated in relevant format in FIGS. 1–4, in which;

FIG. 1 shows a typical starting material comprising a wafer substrate 10 that, in this case, is an SOI wafer having buried oxide insulator (BOX) 15 above which there is a device layer 20, also referred to as the structure layer, that will contain the final sublithographic structure.

An oxide hardmask 30 has been thermally grown or deposited on the top of the structure layer. The sidewall image transfer process forms a sidewall of sublithographic thickness on a dummy pillar formed in a dummy layer 50 and transfers the image to the hardmask, thereby defining a sublithographic hard mask that can be used to define the structure in the structure layer.

Such a process is often used to define the fins for a FINFET, but can also be used for other structures such as capacitor plates.

FIG. 2 shows the result of defining the dummy pillars 55, in which the pillars have a width denoted by bracket 52 that defines the pitch between the sidewalls and therefore the structure pitch between the pairs of final structures that will be formed. When the dummy pillars are defined by a lithographic process, the smallest value of distance 52 will be set by the limit of current lithographic technology.

Bracket 54 denotes the pitch of adjacent pillars and will also have a lower limit set by the current ground rules. The distance between a final structure resulting from a right sidewall on the pillar on the left in FIG. 2 and a corresponding structure resulting from the left sidewall on the pillar on the right in FIG. 2 will be distance 54 minus distance 52.

When the dummy material is amorphous silicon, the pillars 55 may be defined by a reactive ion etch using CF4, CHF3, CH2F2, CH3F, O2, Ar chemistry.

FIG. 3 shows the result of depositing a conformal layer of nitride 60 in a conventional CVD process. The thickness of layer 60 on the sides of pillars 55 (the sidewall thickness) will define the width of the oxide hardmask and thus also define the width of the final structures.

FIG. 4 shows the result of a directional nitride spacer etch using CF4, CHF3, CH2F2, CH3F, O2, Ar chemistry that removes the horizontal components of film 60 as shown. FIG. 4 shows the result of an overetch at the top of the pillars 55 that is required to assure that the lower horizontal component of film 60 resting on the hardmask 30 has been removed. Prior art methods typically planarize the top surface of the pillars and the top surface of the sidewalls.

Circles 32 in FIG. 4 indicate areas where the hardmask film 30 has been damaged by the nitride spacer etch. These areas will etch faster in the etch that defines the hardmask than the areas underneath pillars 55 that are protected by the pillars during this etch. The result of this asymmetry is that the hardmask will not have a flat top (or vertical sides) but will have a slanting top where the damaged oxide was removed more quickly. That defect in the hardmask results in poor quality of definition in the final structures.

Typically, the spacer transfer etch that defines the hard mask using the nitride spacers as a mask is a directional RIE etch. Even though directional, that etch attacks the oxide laterally in the area 32, resulting in the tapered hard mask.

This approach has a number of problems, as would be expected of an attempt to produce a smaller dimension than can be reliably produced using standard techniques.

In particular, transferring the sidewall image to the hard mask layer has been subject to a problem that the etching step that defines the sidewall damages the hardmask layer slightly, compared with the portion of the hard mask layer that is protected by the pillar. When the sidewall image is transferred to the hardmask, there can be differential etching because of the previous differential damage. That differential etching, in turn, can produce a hardmask that is not symmetric and that, in turn, produces a fin that is not up to standard.

An additional problem is that standard technology requires at least one planarization step that is both expensive and prone to cause defects in the material.

SUMMARY OF THE INVENTION

The invention relates to a sidewall image transfer process for forming sublithographic structures in integrated circuit fabrication that adds a hardmask protective layer that eliminates asymmetric damage to the hardmask during a dry etch step.

A feature of the invention is the formation of sidewalls on a dummy pillar to define the sublithographic width of the final structure.

Another feature of the invention is the removal of horizontal components of the sidewall film in a two-step nitride spacer etch process that avoids use of the conventional HF clean after silicon removal.

Yet another feature of the invention is the symmetric and controlled formation of the hard mask used to pattern the final structure.

Yet another feature of the invention is a double sidewall image transfer process, in which the dummy pillar is a sidewall, thereby permitting the pitch between the final structures to be sublithographic.

DETAILED DESCRIPTION

Figure 5:
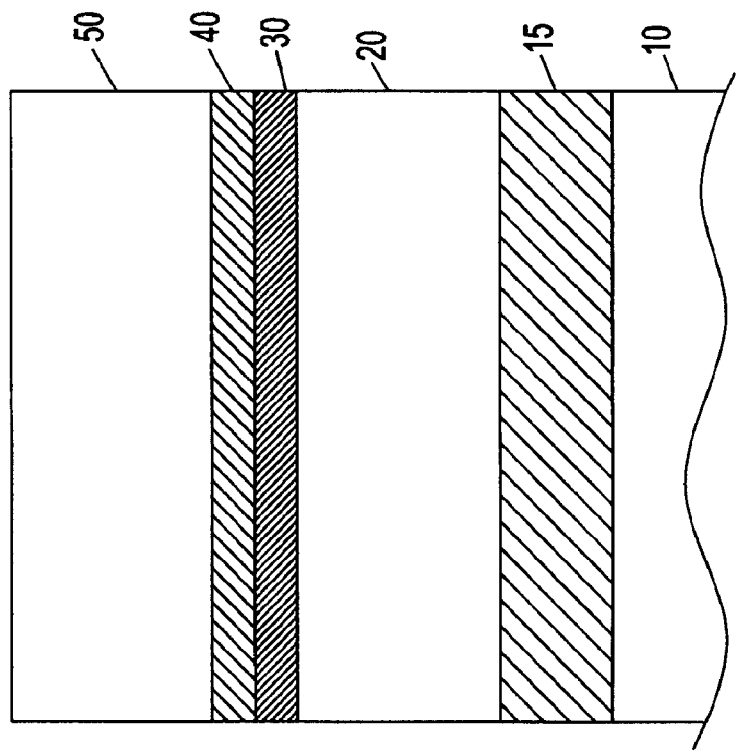

Referring now to FIG. 5, there is shown a stack for use with the invention in which:

substrate 10 is a silicon wafer having an SOI layer 15 and a device layer 20. Other wafers, such as bulk silicon, SiGe alloy, GaAs or others may also be used. In this example, the structure layer 20, which will form the final structure, is nominally 20–30 nm thick.

Oxide hardmask 30 performs the same function as hardmask 30 in the prior art—defining the pattern in structure layer 20. The hard mask layer is etched according to the invention to improve the symmetry of the final structure. Layer 30 is illustratively 20–30 nm thick. The desired thickness will vary with the thickness of the structure to be etched.

Protective nitride layer 40, illustratively 20 nm, is sufficiently thick to prevent damage to the hard mask during the etch and the required overetch of layer 50.

Amorphous silicon layer 50 is illustratively 100–150 nm thick. The thickness of this layer will depend on the desired height of the final structure. The sidewalls have to last during the patterning of the hardmask and the hardmask has to last during the patterning of the final structure.

Figure 2:
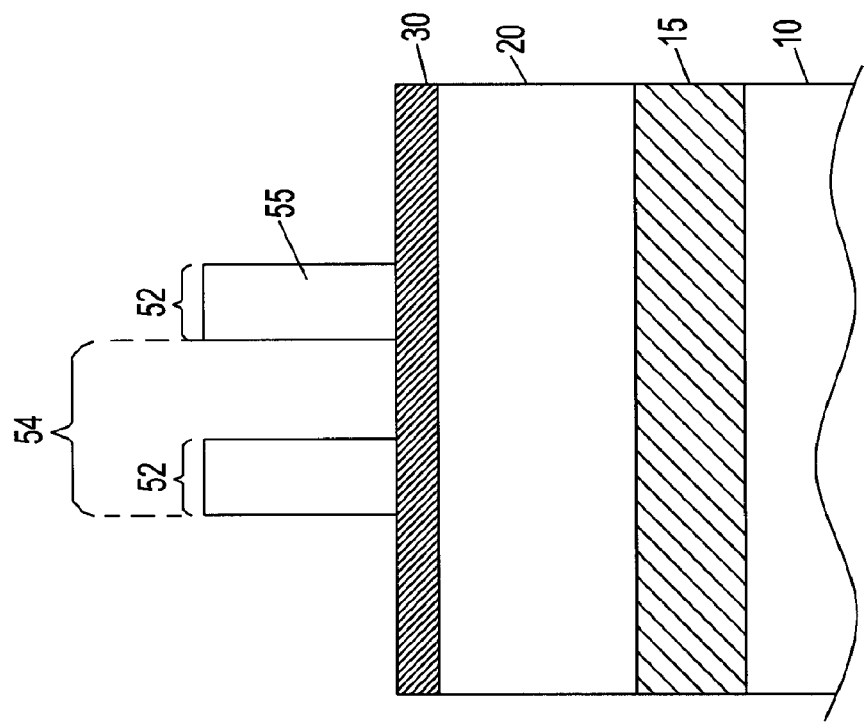
FIGS. 1–4 shows aspects of the prior art.
Figure 1:
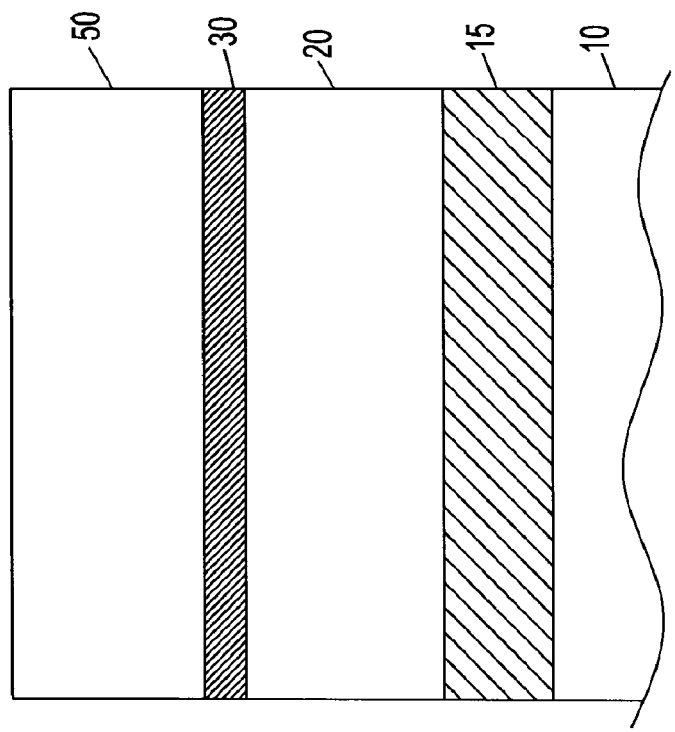
Figure 4:
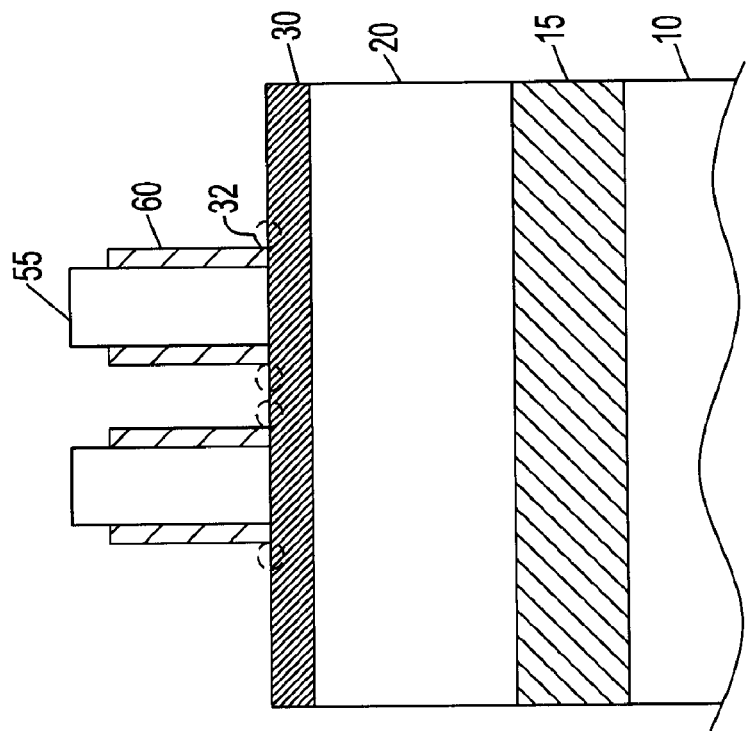
Figure 3:
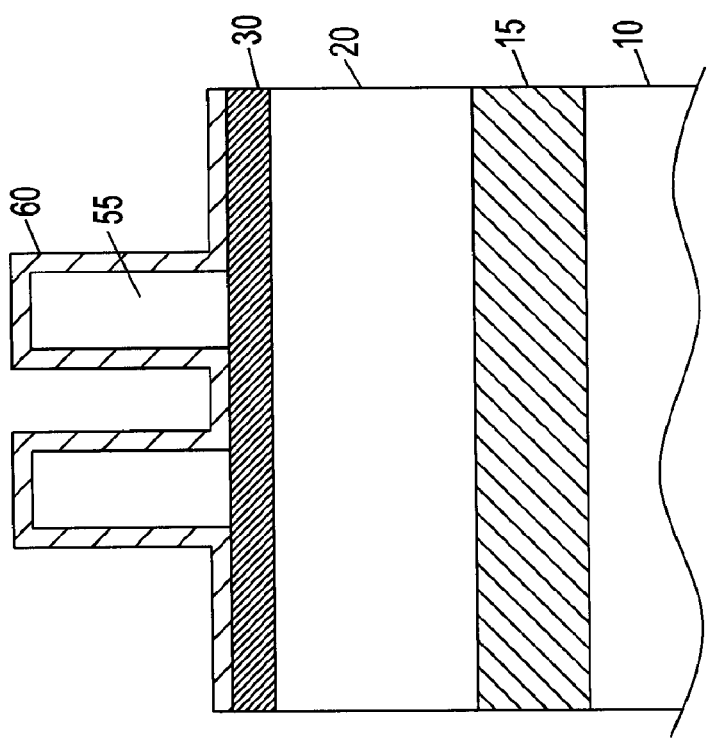
Figure 6:
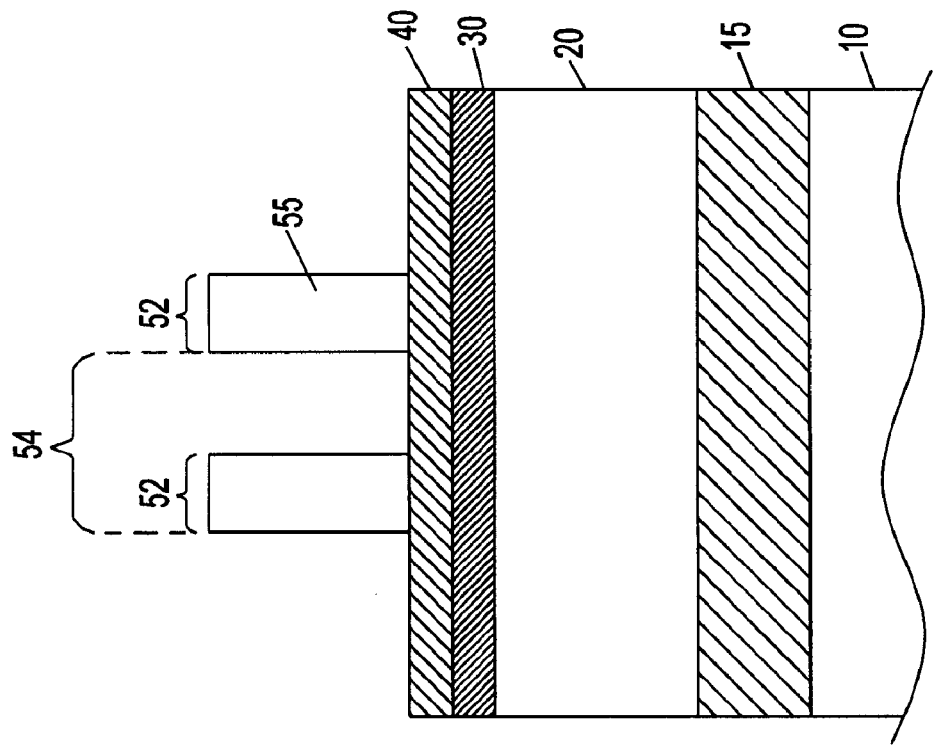
FIGS. 5–14 show steps in a version of the invention.

FIG. 6 shows the result of patterning the dummy pillars 55 that will support the nitride sidewalls. Dimensions 52 and 54 define the same spacing between sidewalls and between groups of sidewalls as in FIG. 2.

Figure 7:
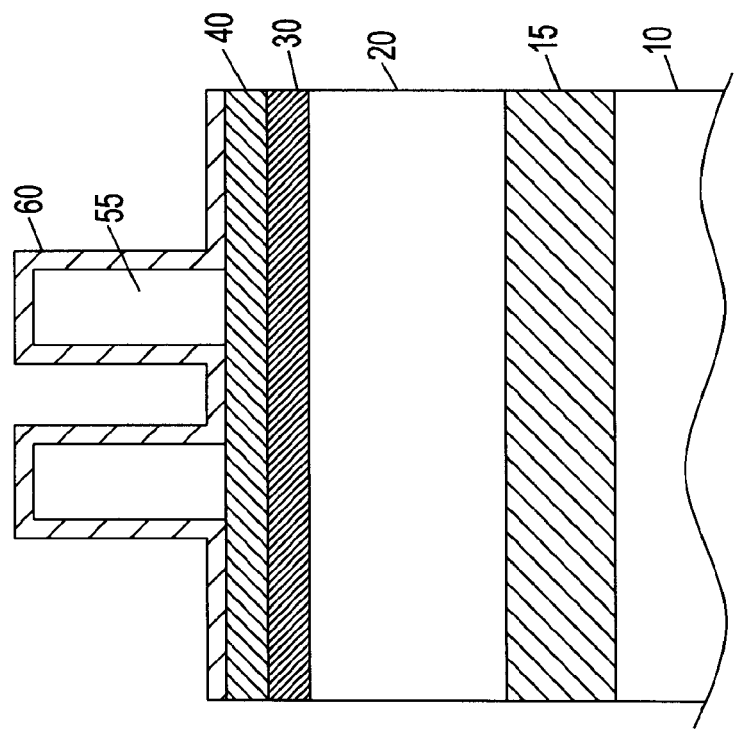

FIG. 7 shows the result of depositing a conformal nitride 60 to form the sidewalls.

Figure 8:
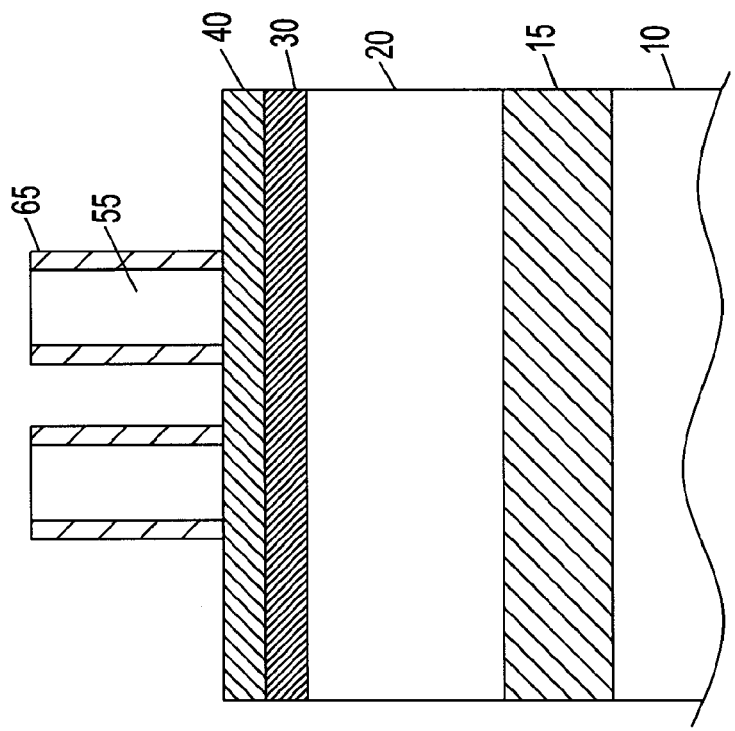

FIG. 8 shows the result of a directional RIE that removes the nitride 60 from the horizontal surfaces on the top of pillars 55 and on the protective layer 40.

Figure 9:
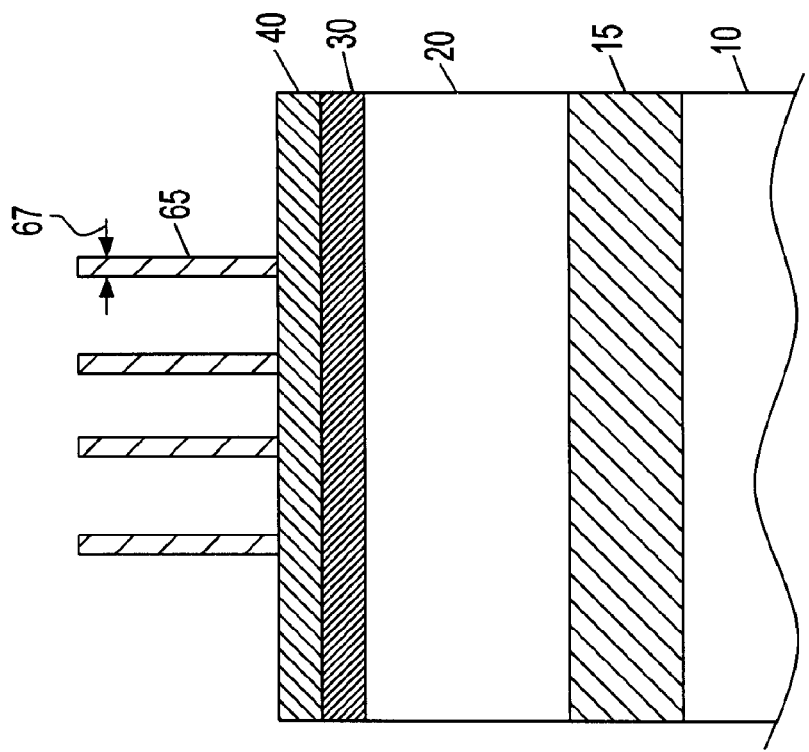

FIG. 9 shows the result of a wet etch that removes the amorphous silicon pillars 55 selective to nitride 60, leaving nitride sidewalls 65 having a width 67 that will be the width of the oxide hardmask.

A beneficial aspect of the invention is that the stack is now symmetric on both sides of each sidewall 65. Protective layer 40 has been present over hardmask layer 30 and symmetric with respect to the sidewalls 65. It does not matter if there is a residual amount of layer 60 because it will be removed along with layer 40.

Figure 10:
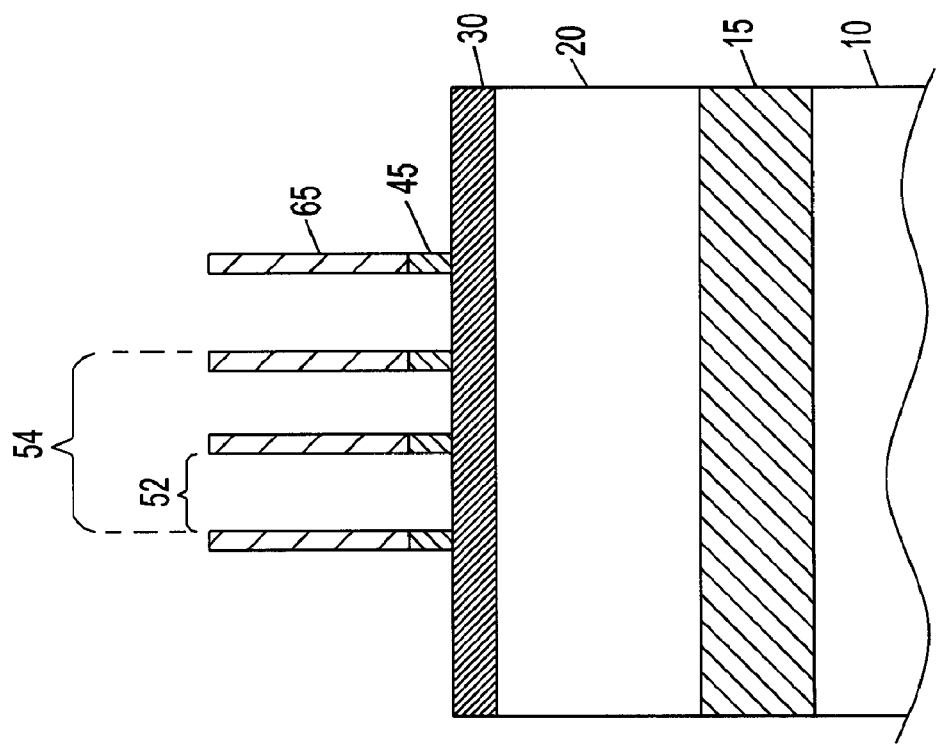
Figure 11:
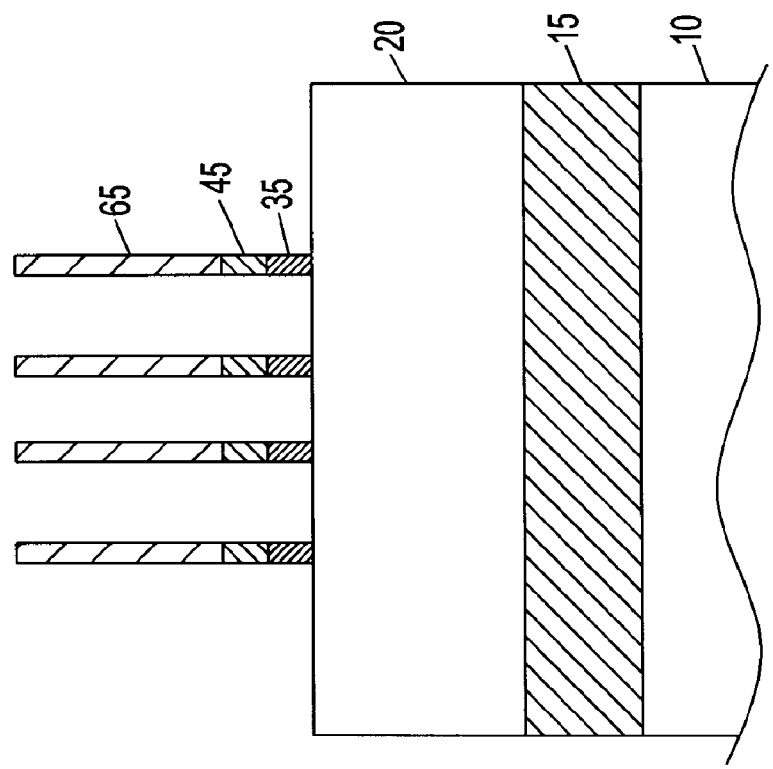

FIG. 10 shows the result of removing layer 40 in a directional RIE that will also remove some of the top of sidewalls 65. This is the second step of a two-step removal of the nitride above the oxide hardmask, the first step being shown in FIG. 8. The remaining elements 45 of layer 40 will be used to pattern the hardmask layer 30, as shown in FIG. 11.

Advantageously, the area on the left and right of sidewalls 65 are both the nitride layer 40. If there is any damage to the hardmask layer 30 at the end of the nitride removal process when there is little or no nitride left, it will be symmetric.

There will be some slight damage to oxide layer 30 during an overetch, when the oxide is exposed to the etch, but it will be symmetric.

No HF clean of oxide 30 is necessary before patterning the oxide because the oxide was not exposed to the etch during silicon removal.

FIG. 10 shows bracket 52 and bracket 54 denoting the same distances as in the prior art.

FIG. 11 shows the result of patterning and transferring the sidewall image to the oxide hardmask, leaving isolated mask elements 35. Illustratively the patterning is done with a directional RIE using a C4F8, Ar, CHF3 chemistry, stopping on the silicon structure layer 20.

Figure 12:
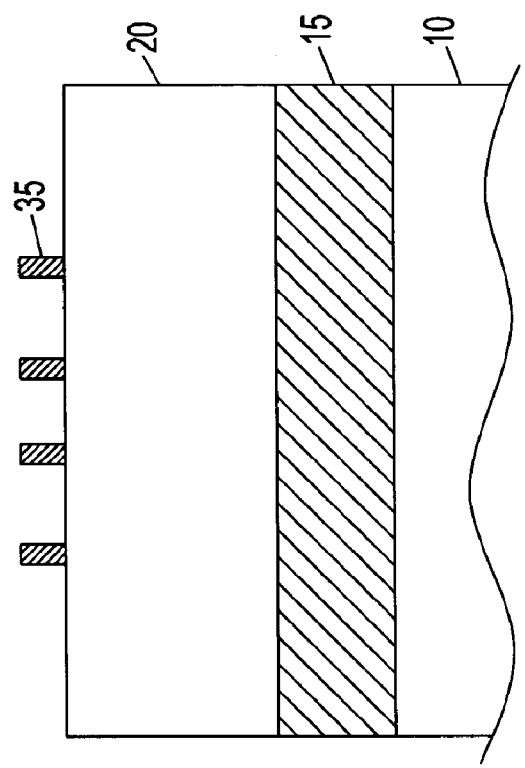

FIG. 12 shows the result of an optional step in which nitride sidewalls 65 are stripped, illustratively in phosphoric acid. Such a strip takes fab resources and need only be done when leaving the sidewalls would interfere with later steps. For example, the nitride pillars have a high aspect ratio and the combination of the nitride pillars and the oxide will have an even higher aspect ratio. The higher the aspect ratio, the greater the danger of mechanical breakage, which can cause defects and even a domino effect. If the oxide mask provides sufficient protection for the patterning, then stripping the nitride pillars removes a source of defects.

Figure 13:
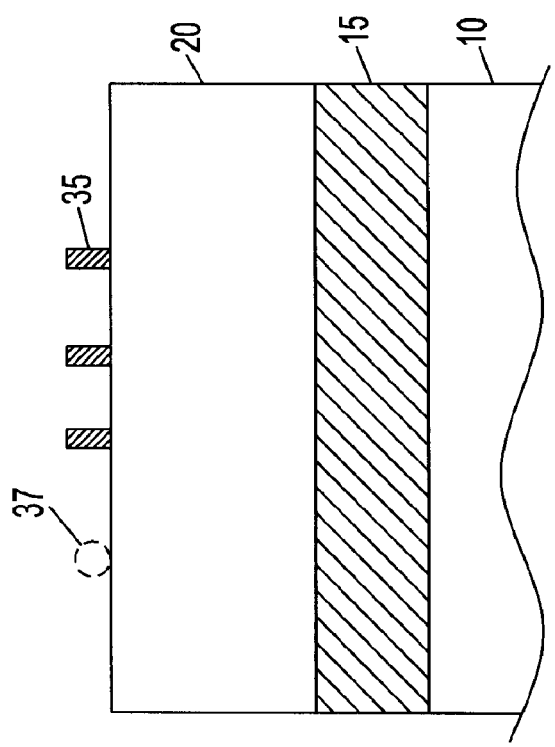

FIG. 13 illustrates the result of another optional step in which a non-critical block mask is used to remove one of the mask elements 35, denoted by the dotted circle 37. This step may be used when the circuit calls for an odd number of structures.

Figure 14:
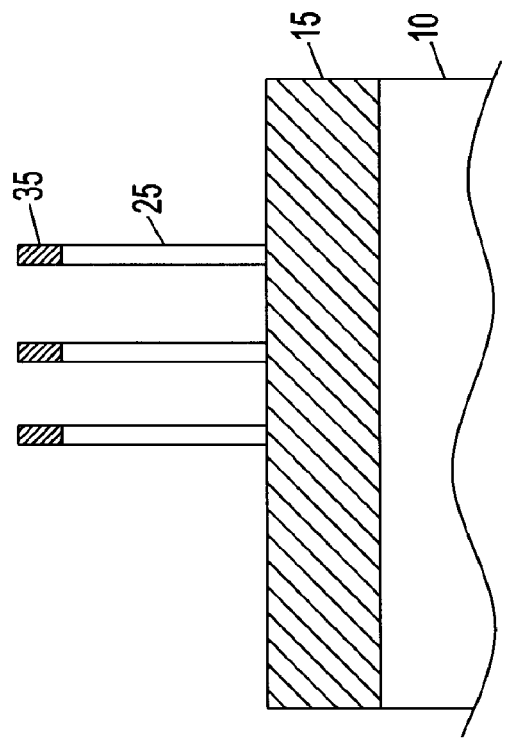

FIG. 14 illustrates the result of etching the structure layer 20 to define a set of fins 25, stopping on BOX 15.

Fins 25 may be used to form the source, drain and body in FINFETs, with or without optionally defining blocks in front of and behind the plane of the paper that tie the fins 25 together, giving mechanical strength and connecting the fins electrically in parallel.

The fins 25 may also be used as capacitor plates, diodes, vertical connecting elements (with appropriate doping), and micro-mechanical structures of various sorts.

In the case of FINFETs, further processing steps such as those illustrated in copending patent application Ser. No. 10/731,584, assigned to the assignee hereof and incorporated by reference, may be used to form the transistors.

Figure 15:
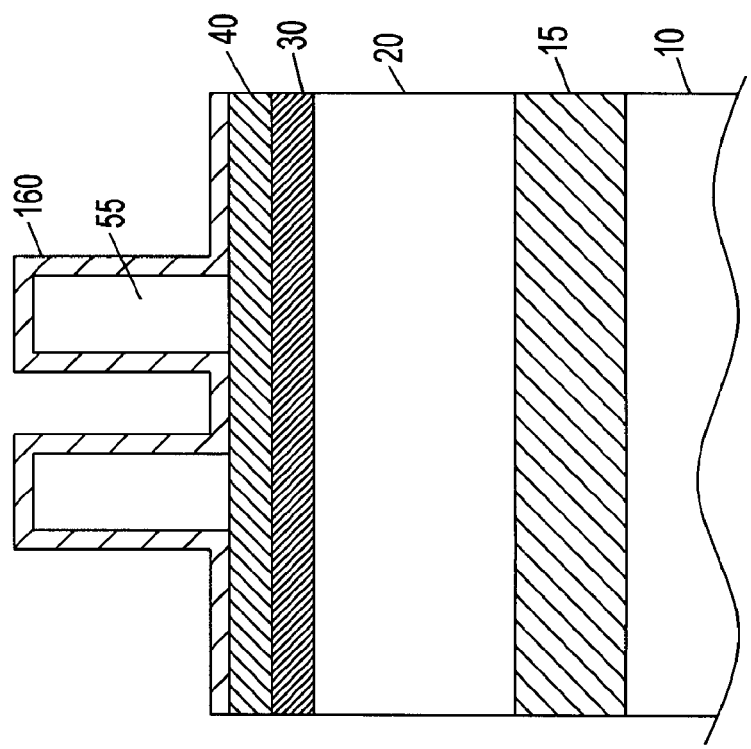

An alternative version of the invention is illustrated starting with FIG. 15, in which the pillars on which the final sidewalls are based are themselves sidewalls—i.e. a double sidewall process.

FIG. 15 shows the result of forming amorphous silicon first level pillars 55, as in FIG. 6. Substrate 10, BOX 15, structure layer 20, oxide hardmask layer 30 and protective nitride layer 40 are the same as in the previous version of the invention.

In this example, the structure layer 20, which will form the final structure, is nominally 20–30 nm thick.

Oxide hardmask 30 performs the same function as hardmask 30 in the prior art—defining the pattern in structure layer 20. The hard mask layer is etched according to the invention to improve the symmetry of the final structure.

Layer 30 is illustratively 20–30 nm thick. The desired thickness will vary with the thickness of the structure to be etched.

A conformal layer of oxide 160 is deposited to a thickness that will define the pitch between the final sidewalls.

Figure 16:
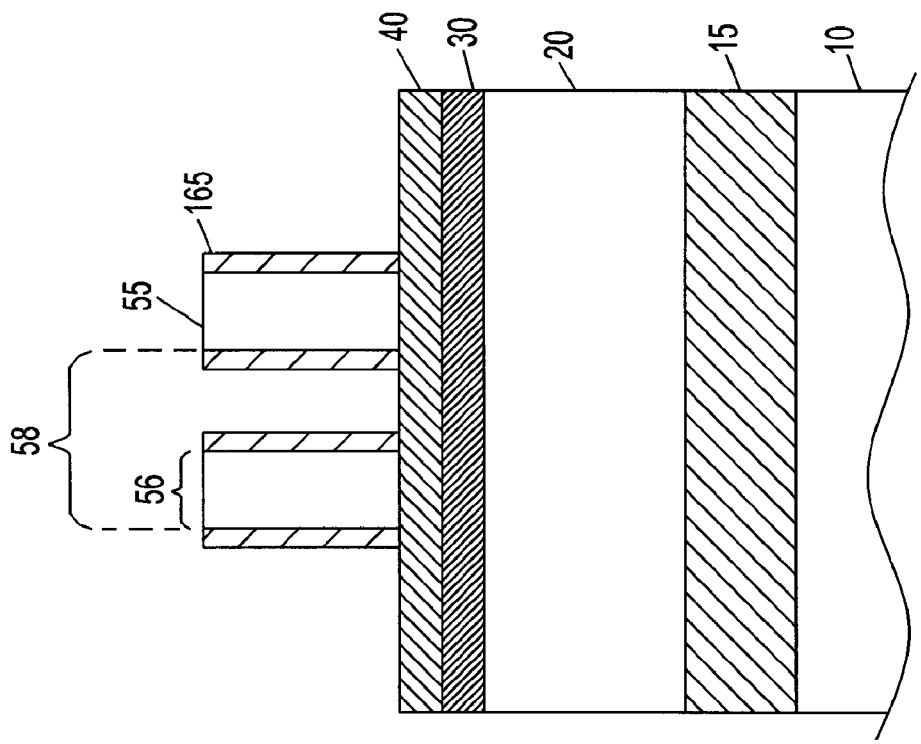
FIGS. 15–20 show steps in an alternative version of the invention.

FIG. 16 shows the result of an oxide spacer etch, in which the horizontal portions of layer 160 have been removed in a directional RIE, using C4F8, Ar, CHF3 chemistry, leaving oxide pillars 165. The silicon pillars 55 have a thickness 56, so the smallest pitch of the oxide pillars is distance 56 plus the thickness of the layer 160. The pitch between adjacent pairs of oxide pillars is distance 58.

Figure 17:
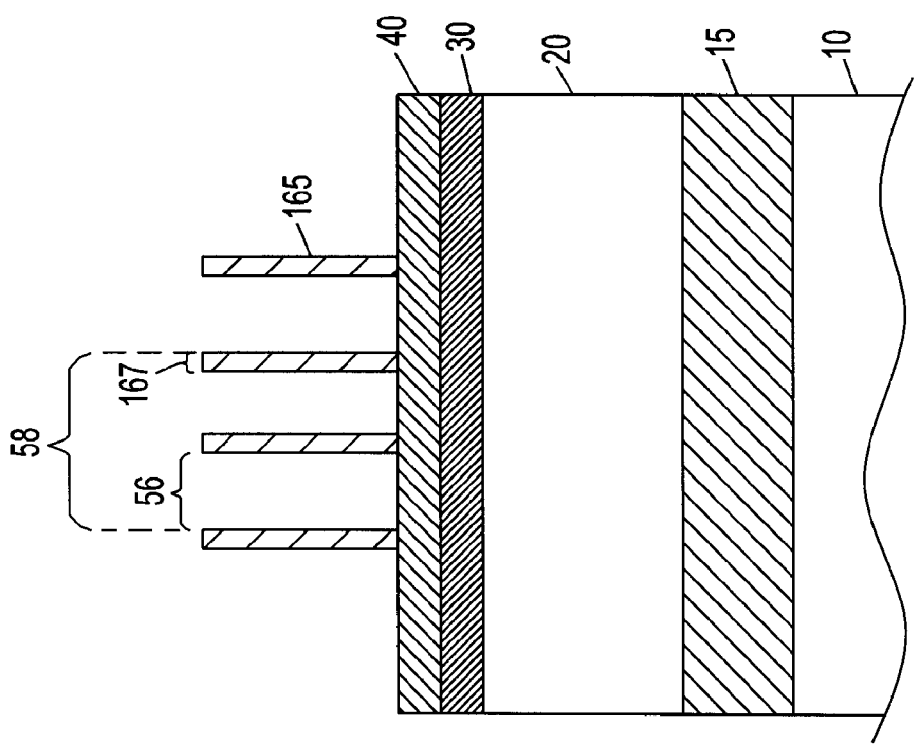

FIG. 17 shows the result of stripping the amorphous silicon dummy layer in an isotropic dry etch or a wet etch such as KOH or NH4OH based chemistry, leaving the oxide pillars 165. The thickness of the pillars 165 is distance 167 and distances 56 and 58 are as discussed above.

Figure 18:
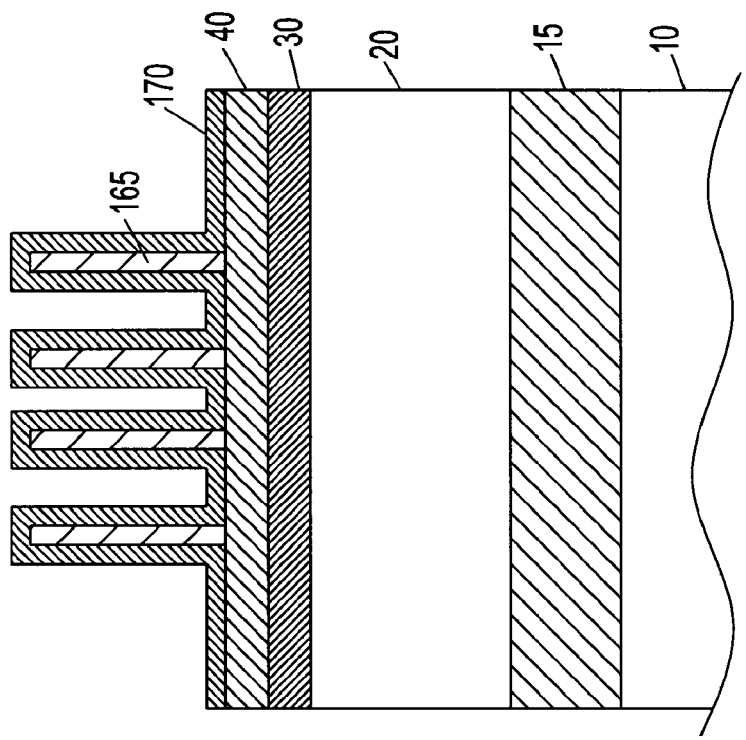

FIG. 18 shows the result of depositing a conformal layer of nitride 170 over oxide second level pillars 165.

Figure 19:
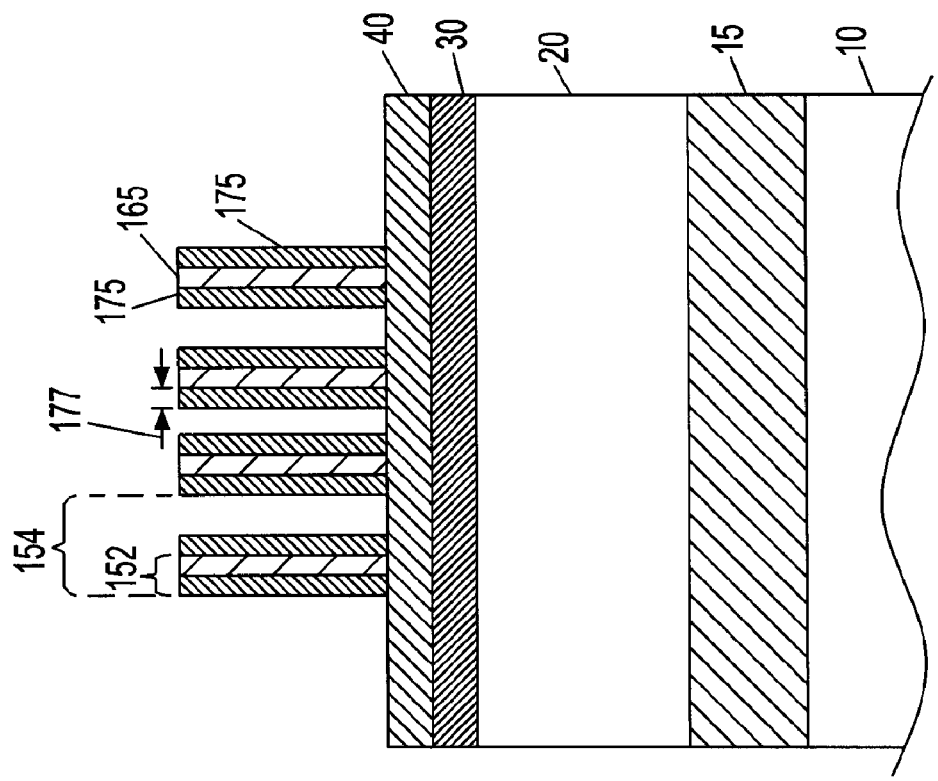

FIG. 19, similar to FIG. 8, shows the result of a directional RIE that removes the horizontal components of the conformal nitride layer 170, leaving the vertical sidewall members 175. The thickness of sidewalls 175 is denoted by distance 177, nominally the same as the thickness of the final structure formed in layer 20. Bracket 152 denotes the smallest pitch of the structures that will be formed in layer 20. Bracket 154 denotes the pitch of pairs of the structures—i.e. of the first level of sidewalls. It is the same as distance 56 in FIG. 17.

Figure 20:
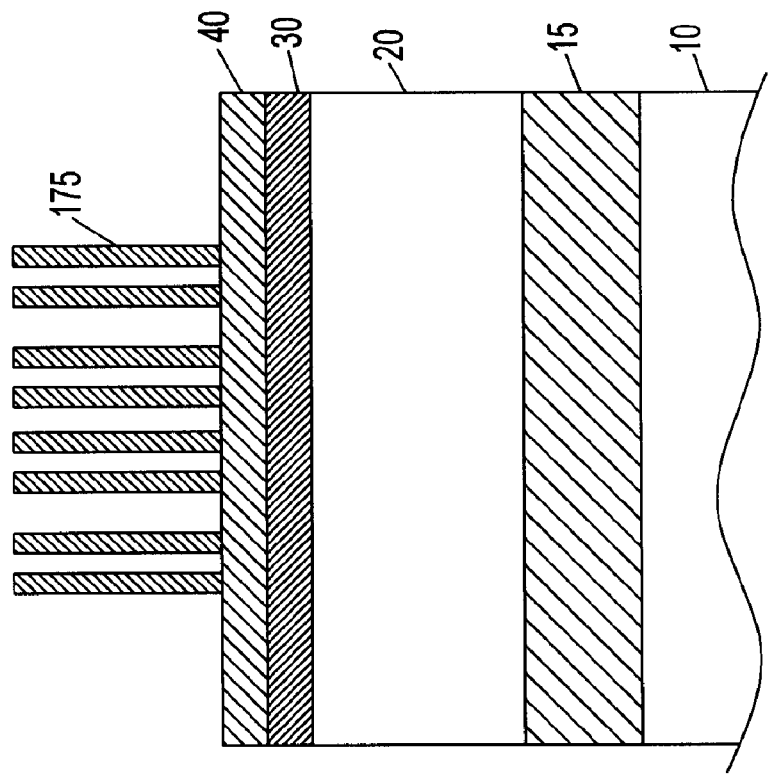

FIG. 20, similar to FIG. 9, shows the result of stripping the oxide temporary pillars 165.

The remaining steps in this alternative process are similar to those shown in FIGS. 10 to 14. The sidewalls 175 are used to pattern layer 40.

The combined nitride sidewall/layer 40 is used to pattern oxide layer 30, resulting in a sublithographic hardmask that has a spacing set by the sidewalls on temporary pillars 165, so that the spacing also will be sublithographic in this version of the invention.

Structure layer 20 is patterned with the oxide hard mask as before, resulting in a structure similar to that of FIG. 14, but with smaller spacing.

The further steps in this version of the invention—building a structure that uses the fins defined as set forth above—will be the same as for the previous embodiment of the invention.

While the invention has been described in terms of a single preferred embodiment, those skilled in the art will recognize that the invention can be practiced in various versions within the spirit and scope of the following claims.

What is claimed is:

1. A method of forming an integrated circuit structure in a structure layer disposed above a substrate comprising the steps of:

Forming a hardmask layer disposed above said structure layer;

Forming a protective layer above said hardmask layer;

Forming a temporary layer above said protective layer;

Patterning said temporary layer in a set of pillars in positions related to positions of said structures;

Forming a conformal layer over said set of pillars, said conformal layer having a top portion on top of said pillars, sidewalls adjacent to sides of said set of pillars and a horizontal portion extending between members of said set of pillars and disposed directly on top of said protective layer;

Removing at least said top portion of said conformal layer;

Removing said set of pillars, whereby said protective layer in locations beneath said set of pillars is exposed;

Etching said protective layer, using said sidewalls as a mask, thereby defining a first set of hardmask regions in said protective layer;

Etching said hardmask layer using said first set of hardmask regions in said protective layer as hardmask, thereby defining a second set of hardmask in said hardmask layer that are symmetric on opposite sides of said sidewalls; and Etching said structure layer using said second set of hardmask, thereby forming said structures.

2. A method according to claim 1, in which a further step comprises depositing and patterning a block mask that exposes selected members of said set of hardmask regions and stripping said hard mask regions selective to said structure layer, thereby changing the number of hardmask regions.

3. A method according to claim 1, in which a further step strips said sidewalls and said first set of hardmask, before said step of etching said structure layer.

4. A method according to claim 2, in which a further step strips said sidewalls and said first set of hardmask, before said step of etching said structure layer.

5. A method according to claim 1, in which said structure layer is silicon, said hardmask layer is oxide and said protective layer is nitride.

6. A method according to claim 5, in which said substrate is an SOI silicon substrate.

7. A method according to claim 5, in which said substrate is a bulk silicon substrate.

8. A method according to claim 1, in which said structure layer is silicon-germanium alloy, said hardmask layer is oxide and said protective layer is nitride.

9. A method according to claim 8, in which said substrate is silicon with a layer of buried insulator separating said substrate from said structure layer.

10. A method according to claim 8, in which said substrate is a bulk silicon substrate with a structure layer of Silicon-Germanium alloy formed on a top surface thereof.

11. A method of forming an integrated circuit structure in a structure layer disposed above a substrate comprising the steps of:

Forming a hardmask layer disposed above said structure layer;

Forming a protective layer above said hardmask layer;

Forming a temporary layer above said protective layer;

Patterning said temporary layer in a set of pillars in positions related to positions of said structures;

Forming a first conformal layer over said set of pillars, said first conformal layer having a top portion on top of said pillars, first sidewalls adjacent to sides of said set of pillars and a first horizontal portion extending between members of said set of pillars and disposed directly on top of said protective layer;

Removing at least said top portion of said first conformal layer;

Removing said set of pillars, thereby defining a first set of sidewalls;

Depositing a second conformal layer over said first set of sidewalls;

Removing at least said top portion of said second conformal layer;

Removing said first set of sidewalls, thereby defining a second set of sidewalls formed from said second conformal layer, whereby said protective layer in locations beneath said first set of sidewalls is exposed;

Etching said protective layer, using said second set of sidewalls as a mask, thereby defining a first set of hardmask regions in said protective layer;

Etching said hardmask layer using said first set of hardmask regions in said protective layer as hardmask, thereby defining a second set of hardmask in said hardmask layer that are symmetric on opposite sides of said sidewalls; and Etching said structure layer using said second set of hardmask, thereby forming said structures.

12. A method according to claim 11, in which a further step comprises depositing and patterning a block mask that exposes selected members of said set of hardmask regions and stripping said hard mask regions selective to said structure layer, thereby changing the number of hardmask regions.

13. A method according to claim 11, in which a further step strips said second set of sidewalls and said first set of hardmask, before said step of etching said structure layer.

14. A method according to claim 12, in which a further step strips said second set of sidewalls and said first set of hardmask, before said step of etching said structure layer.

15. A method according to claim 11, in which said structure layer is silicon, said hardmask layer is oxide and said protective layer is nitride.

16. A method according to claim 15, in which said substrate is an SOI silicon substrate.

17. A method according to claim 15, in which said substrate is a bulk silicon substrate.

18. A method according to claim 11, in which said structure layer is silicon-germanium alloy, said hardmask layer is oxide and said protective layer is nitride.

19. A method according to claim 18, in which said substrate is silicon with a layer of buried insulator separating said substrate from said structure layer.

20. A method according to claim 18, in which said substrate is a bulk silicon substrate with a structure layer of Silicon-Germanium alloy formed on a top surface thereof.

* * * * *